BISTABLE ELECTROLUMINESCENT INSULATED GATE
FIELD EFFECT SEMICONDUCTOR DEVICE
Filed April 17, 1968
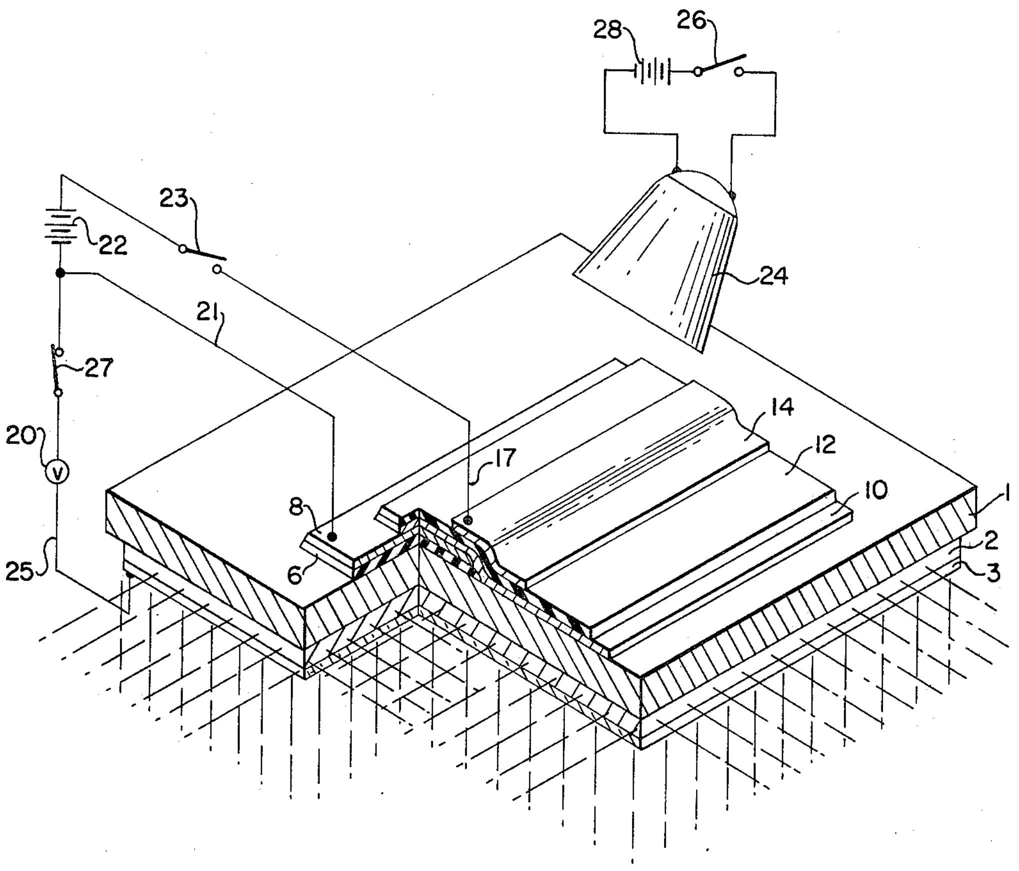
INVENTOR
JOHN L. JANNING
BY Louis A Kline
John J. Callahan
HIS ATTORNEYS United States Patent Office 3,492,549
Patented Jan. 27, 1970

3,492,549

BISTABLE ELECTROLUMINESCENT INSULATED GATE FIELD EFFECT SEMICONDUCTOR DEVICE

John L. Janning, Dayton, Ohio, assignor to The National Cash Register Company, Dayton, Ohio, a corporation of Maryland Filed Apr. 17, 1968, Ser. No. 721,969
Int. Cl. H01l *11/00, 15/00*
U.S. Cl. 317—235 4 Claims

ABSTRACT OF THE DISCLOSURE

The bistable electroluminescent insulated gate field effect semiconductor device of the present invention comprises a bistable insulated gate field effect semiconductor device having an upper source electrode layer insulated from a lower rigid drain electrode layer, an electroluminescent layer, and a transparent electrode layer having been built upon the opposite side of said rigid drain electrode layer.

CROSS-REFERENCE TO RELATED APPLICATION

A copending patent application entitled "Bistable Insulated Gate Field Effect Semiconductor Device" and having U.S. Ser. No. 669,490, filed Sept. 21, 1967, in the name of John L. Janning, is assigned to the assignee of the present patent application. That invention relates to a bistable insulated gate field effect semiconductor device comprising a semiconductor material layer, a first side of an internally polarizable phosphor insulator layer in contact with the semiconductor material layer, a translucent gate electrode film in contact with a second side of the internally polarizable phosphor insulator layer, and two sensing electrodes attached to the semiconductor material layer at points on either side of a vertical line passing through the center of the translucent gate electrode film. The bistable insulated gate field effect semiconrductor device is switched from a first stable state, wherein the phosphor insulator layer is unpolarized, to a second stable state, wherein the phosphor insulator layer is polarized. The phosphor insulator layer is internally polarized by at least momentarily applying an external electric field across the phosphor insulator layer from a voltage potential between the gate electrode film and one sensing electrode and concurrently illuminating the phosphor insulator layer with light, which light first passes through the translucent gate electrode film, to create an internal electric field within the phosphor insulator layer. The internal electric field within the phosphor insulating layer is then incident upon the semiconductor material layer, so as to change the resistance through the semiconductor material layer. The internal electric field of the phosphor insulator layer is destroyed by again illuminating the phosphor insulator layer, no external electric field being applied to the phosphor insulator layer. A first bistable state of each bistable insulated gate field effect semiconductor device exists when the phosphor insulator layer is unpolarized, and a second stable state of each bistable insulated gate field effect semiconductor device exists when the phosphor insulator layer is polarized.

The structure of the bistable electroluminescent insulated gate field effect semiconductor device of the present invention includes a bistable insulated gate field effect semiconductor device having an upper source electrode layer insulated from a lower rigid drain electrode layer. The lower rigid drain electrode layer has on its other side, consecutively, an electroluminescent layer and a translucent electrode layer.

A bistable insulated gate field effect semiconductor device having an upper source electrode insulated from a lower drain electrode is not shown in the copending U.S. patent application. Only a coplanar source electrode layer and a drain electrode layer are disclosed. In accordance with the present invention, the source electrode and the drain electrode are stacked upon one another with an intermediate electrical insulator layer, so that a bistable insulated gate field effect semiconductor device will control the passage of current through an electroluminescent layer and a translucent electrode layer upon the free side of the rigid drain electrode layer of a bistable insulated gate field effect semiconductor device. In addition, a rigid drain electrode layer is also used to support an electroluminescent layer and a translucent electrode layer. In distinction to that disclosed in said copending U.S. patent application, an electroluminescent layer is used to optically indicate the state of a bistable electroluminescent insulated gate field effect semiconductor device .

BACKGROUND OF THE INVENTION

U.S. Patent No. 3,246,162, entitled "Electroluminescent Device Having a Field-Effect Transistor Addressing System" and issued Apr. 12, 1966, on the application of Te Ning Chin, discloses a bistable device wherein an electroluminescent cell having two translucent electrodes is attached to the p-material side of a p-n junction element. The illumination from the electroluminescent cell is passed through the intermediate translucent electrode and on to the p-material, thereby decreasing the resistantance of the n-material, to place the device in an active state.

The bistable electroluminescent insulated gate field effect semiconductor device of the present invention has an opaque rigid drain electrode layer. No illumination coupling is required between the semiconductor material layer and the electroluminescent layer to hold the bistable electroluminescent insulated gate field effect semiconductor device in its active luminescent state, as is necessary for the bistable device of Te Ning Chin.

DESCRIPTION OF THE DRAWING

The figure is a perspective view of the bistable electroluminescent insulated gate field effect semiconductor device of the present invention.

SUMMARY OF THE INVENTION

The bistable electroluminescent insulated gate field effect semiconductor device of the present invention comprises a rigid drain electrode layer, an electroluminescent layer upon the first side of said rigid drain electrode layer, a translucent electrode layer upon said electroluminescent layer, an electrical insulator layer upon a section of a second side of said rigid drain electrode layer, a source electrode layer upon said electrical insulator layer, a doped semiconductor material layer between said source electrode layer and the second side of said rigid drain electrode layer, a polarizable phosphor insulator layer upon said semiconductor material layer, and a translucent gate electrode film upon said polarizable phosphor insulator layer.

The bistable electroluminescent insulated gate field effect semiconductor device is used as part of an electrical circuit which additionally includes a D.C. voltage means between said source electrode layer and said translucent gate electrode film for intermittently applying a polarizing voltage upon said translucent gate electrode film with respect to the voltage upon said source electrode layer, and a pulsating D.C. voltage means betwen said source electrode layer and said translucent electrode layer for intermitently applying a pulsating D.C. voltage between said source electrode layer and said translucent electrode layer to cause said electroluminescent layer to luminesce if said polarizable phosphor insulator layer is polarized.

An illuminating means for intermittently applying a polarizing illumination to said polarizable phosphor insulator layer is provided in the space above said translucent gate electrode film.

DESCRIPTION OF THE PREFERRED EMBODIMENT

The bistable electroluminescent insulated gate field effect semiconductor device of the figure is constructed upon a rigid drain electrode layer 1, such as a 0.020-inch-thick stainless steel rigid drain electrode layer, by first depositing an electroluminescent layer 2, as by vacuum deposition, such as a 2$\mu$ zinc sulfide electroluminescent layer, upon a first side of the stainless steel rigid drain electrode layer 1, and then depositing a translucent electrode layer 3, by spraying or vacuum deposition, such as a 0.01$\mu$ tin oxide translucent electrode layer 3, upon the electroluminescent layer 2. A narrow electrical insulator layer 6, such as a 1$\mu$ silicon monoxide electrical insulator layer 6, is vacuum-deposited upon a second side of the rigid drain electrode layer 1. Upon the electrical insulator layer 6 is vacuum-deposited a source electrode layer 8, such as a 0.1$\mu$ gold source electrode layer 8. A semiconductor material layer 10, such as a 2$\mu$ n-type cadmium selenide semiconductor material layer 10, is deposited between the gold source electrode layer 8 and the second side of the stainless steel rigid drain electrode layer 1 by vacuum deposition. A part of the upper surface of the gold source electrode layer 8 is left exposed, so as to allow circuit contact therewith. A polarizable phosphor insulator layer 12, such as a 0.2$\mu$ anthracene polarizable phosphor insulator layer, is vacuum-deposited upon the n-type cadmium selenide semiconductor material layer 10. A translucent gate electrode film 14, such as a 0.01$\mu$ thick translucent aluminum gate electrode film 14, is vacuum-deposited upon the area of the anthracene polarizable phosphor insulator layer 12, which area lies above the semiconductor material of the n-type semiconductor material layer 10, which semiconductor material lies betwen the gold source electrode layer 8 and the second side of the stainless steel rigid drain electrode layer 1.

A zinc sulfide, zinc sulfide plus cadmium sulfide, chrysene, 9 - bromoanthracene, trans-stilbene, or other type of polarizable phosphor insulator layer can be used instead of an anthracene polarizable phosphor insulator layer 12.

A copper gate electrode lead wire 17 is attached to the translucent aluminum gate electrode film 14 by use of silver conductive paint. A copper source electrode lead wire 21 is attached to the gold source electrode layer 8, and a copper translucent electrode lead wire 25 is attached to the tin oxide translucent electrode layer 3.

The translucent aluminum gate electrode film 14 is of such a thickness, as 0.01$\mu$, that light can pass through it to illuminate the anthracene polarizable phosphor insulator layer 12 thereunder.

A pulsating D.C. voltage means 20, such as a half wave rectified A.C. voltage, is attached to the copper source electrode lead wire 21 and the copper translucent electrode lead wire 25 through a switch 27. A D.C. nonpulsating voltage means, such as a 20-volt battery 22, is attached between the copper gate electrode lead wire 17 and the source electrode lead wire 21 to induce a polarizing voltage of 20-volt positive potential on the translucent aluminum gate electrode film 14, with respect to the gold source electrode layer 8, for an n-type cadmium selenide semiconductor material layer 10. A switch 23 is included in this battery circuit to alternately apply or remove the positive gate voltage to or from the translucent aluminum gate electrode film with respect to the gold source electrode layer 8. An illuminating means, such as a 15-microwatt/cm.$^2$ intensity ultraviolet light mercury discharge lamp 24, is disposed above the translucent aluminum gate electrode film 14 in order to illuminate the anthracene polarizable phosphor insulator layer 12. The mercury discharge lamp 24 is energized by a battery 28, by closing a switch 26.

The bistable electroluminescent insulated gate field effect semiconductor device of the figure may be placed in its second stable polarized state by concurrently closing the switch 23 and the switch 26, as for thirty seconds, then opening the switch 26 before opening the switch 23, in order to polarize the anthracene polarizable phosphor insulator layer 12. The anthracene polarized phosphor insulated layer 12 presents a voltage to the n-type semiconductor material layer 10, so as to decrease the resistance of the n-type semiconductor material layer 10.

With the switch 27 closed, a current begins to flow from the pulsating D.C. voltage means 20 through the gold source electrode layer 8, through the semiconductor material of the n-type semiconductor material layer 10, which semiconductor material lies between the gold source electrode layer 8 and the second side of the steel rigid drain electrode layer 1, through the steel rigid drain electrode layer 1, through the zinc sulfide electroluminescent layer 2, to the tin oxide translucent electrode layer 3, so as to cause light to be emitted from the zinc sulfide electroluminescent layer 2 of the bistable electroluminescent insulated gate field effect semiconductor device. The light from the zinc sulfide electroluminescent layer 2 may be observed upon its passage through the tin oxide translucent electrode layer 3.

For an n-type semiconductor material layer 10, the polarizing voltage must be a positive voltage, induced by the non-pulsating D.C. voltage means 22, upon the translucent gate electrode film 14 with respect to the source electrode layer 8, so as to properly polarize a polarizable phosphor insulator layer 12, so as to cause the resistance of the n-type semiconductor material layer 10 to be decreased. For a p-type semiconductor material layer 10, the polarizing voltage must be a negative voltage, induced by the D.C. voltage means 22, upon the translucent gate electrode film 14 with respect to the source electrode layer 8.

The bistable electroluminescent insulated gate field effect semiconductor device of the figure may be placed in its first stable depolarized state by closing the switch 26, as for one second, with the switch 23 open, so as to depolarize the anthracene polarizable phosphor insulator layer 12. The resistance of the n-type semiconductor material layer 10 will increase to its highest resistance value, due to the absence of the voltage induced across the n-type semiconductor material layer 10 by the anthracene polarizable phosphor insulator layer 12. The current from the pulsating D.C. voltage means 20 will cease to flow through the semiconductor material of the n-type semiconductor material layer 10, which lies between the gold source electrode layer 8 and the second side of the stainless steel rigid drain electrode layer 1, due to the large increase in the resistance of the n-type semiconductor material layer 10. No light will then be emitted from the zinc sulfide electroluminescent layer 2, due to this stoppage of current.

The polarization of the anthracene polarizable phosphor insulator layer 12 of the figure is due to a charge separation within the anthracene polarizable phosphor insulator layer 12. The charge separation is created by concurrent application, for an n-type semiconductor material layer 10, of a positive electric voltage potential, from the battery 22 to the translucent aluminum gate electrode film 14 with respect to the potential applied to the gold source electrode layer 8, and illumination of the anthracene polarizable phosphor insulator layer 12. Electrons of the anthracene polarizable phosphor insulator layer 12 are drawn to the top side of the anthracene polarizable phosphor insulator layer 12. The electrons will not soon return, even though the illumination and the etxernal field are consecutively removed, as the anthracene polarizable phosphor insulator layer 12 is a poor conductor of electrons. In fact, charge separation will continue for at least several hours.

The n-type cadmium selenide semiconductor material layer 10 is affected by the polarized molecules from a region of the polarized anthracene phosphor insulator layer 12 adjacent to the n-type cadmium selenide semiconductor material layer 10, even though the illumination from the mercury discharge lamp 24 and the externally applied positive voltage potential from the battery 22 are consecutively removed from the bistable electroluminescent insulated gate field effect semiconductor device after polarization of the anthracene polarizable phosphor insulator layer 12 has occurred. Current will more easily pass between the gold source electrode layer 8 through the n-type cadmium selenide semiconductor material layer 10 to the steel rigid drain electrode layer 1. The current will continue successively through the zinc sulfide electroluminescent layer 2, to the tin oxide translucent electrode layer 3, and returns to the pulsating D.C. voltage means 20.

When light is flashed upon the polarized anthracene phosphor insulator layer 12 of the figure, which light first passes through the ultra-thin translucent aluminum gate electrode film 14, with the external field of the battery 22 removed from the copper gate electrode lead wires 17 by means of the switch 23, a charge separation within the polarized anthracene phosphor insulator layer 12 is destroyed, to form an unpolarized anthracene phosphor insulator layer 12. The anthracene polarizable phosphor insulator layer 12 will not then act upon the n-type semiconductor material layer 10 to affect the electrical resistance of the n-type semiconductor material layer 10. The bistable electroluminescent insulated gate field effect seminconductor device consequently is returned to its first stable state of high electrical resistance. In other words, the resistance to current from the gold source electrode layer 8 through the n-type cadmium selenide semiconductor material layer 10 to the stainless steel rigid drain electrode layer 1 is greater than was the resistance when the anthracene polarizable phosphor insulator layer 12 of the bistable electroluminescent insulated gate field effect semiconductor device was polarized, as sensed by the non-luminescence of the zinc sulfide electroluminescent layer 2.

If a pulsating D.C. voltage is applied to the bistable electroluminescent insulated gate field effect semiconductor device of the present invention by the switch 27, said bistable electroluminescent insulated gate field effect semiconductor device will optically indicate whether it is in a polarized state or is in an unpolarized state. The bistable electroluminescent insulated gate field effect semiconductor device will, however, remain in its polarized state for several days, at least, without a voltage being applied between the source electrode layer 8 and the translucent electrode layer 3 by the switch 27. That is, no power is required to hold a bistable electroluminescent field effect semiconductor device in a polarized state, but power is required to cause a polarized bistable electroluminescent field effect semiconductor device to optically indicate whether it is in a polarized state. Luminescence of the bistable electroluminescent insulated gate field effect semiconductor device, upon closing the switch 27, signifies that the concurrent closing of the switch 23 and the switch 26 has occurred. Non-luminescence of the bistable electroluminescent insulated gate field effect semiconductor device, upon closing the switch 27, signifies that concurrent closing of the switch 23 and the switch 26 has not occurred.

What is claimed is:

1. A bistable electroluminescent insulated gate field effect semiconductor device comprising:

(a) a rigid drain electrode layer;

(b) an electroluminescent layer upon a first side of said rigid drain electrode layer;

(c) a translucent electrode layer upon said electroluminescent layer;

(d) an electrical insulator layer upon a section of a second side of said rigid drain electrode layer;

(e) a source electrode layer upon said electrical insulator layer;

(f) a doped semiconductor material layer between the source electrode layer and the second side of said rigid drain electrode layer;

(g) a polarizable phosphor insulator layer upon said semiconductor material layer; and (h) a translucent gate electrode film upon said polarizable phosphor insulator layer.

2. A bistable electroluminescent insulated gate field effect semiconductor device circuit comprising:

(a) a rigid drain electrode layer;

(b) an electroluminescent layer upon a first side of said rigid drain electrode layer;

(c) a translucent electrode layer upon said electroluminescent layer;

(d) an electrical insulator layer upon a section of a second side of said rigid drain electrode layer;

(e) a source electrode layer upon said electrical insulator layer;

(f) a semiconductor material layer between said source electrode layer and the second side of said rigid drain electrode layer;

(g) a polarizable phosphor insulator layer upon said semiconductor material layer;

(h) a translucent gate electrode film upon said polarizable phosphor insulator layer;

(i) a first voltage means between said source electrode layer and said translucent gate electrode film for intermittently applying a polarizing voltage upon said translucent gate electrode film with respect to the voltage upon said source electrode layer;

(j) an illuminating means for intermittently applying a polarizing illumination to said polarizable phosphor insulator layer, provided in the space above said translucent gate electrode film; and (k) a second voltage means between said source electrode layer and said translucent electrode layer for intermittently applying a voltage between said source electrode layer and said translucent electrode layer to cause said electroluminescent layer to luminesce if said polarizable phosphor insulator layer is polarized.

3. The bistable electroluminescent insulated gate field effect semiconductor device as claimed in claim 2 wherein the first voltage means is a non-pulsating D.C. voltage means.

4. The bistable electroluminescent insulated gate field effect semiconductor device as claimed in claim 3 wherein the second voltage means is a pulsating D.C. voltage means.

References Cited

UNITED STATES PATENTS

| | | | |
|---|---|---|---|
| 3,400,383 | 9/1968 | Meadows et al. | 340—173 |
| 3,385,731 | 5/1968 | Weimer | 117—212 |
| 3,173,014 | 3/1965 | Fenner | 250—213 |
| 3,307,089 | 2/1967 | Yamashita | 317—234 |
| 3,384,792 | 5/1968 | Kazan et al. | 317—235 |

JOHN W. HUCKERT, Primary Examiner

MARTIN H. EDLOW, Assistant Examiner

U.S. Cl. X.R.

313—108